(12) United States Patent
Grebennikov et al.

(10) Patent No.: US 7,511,658 B1
(45) Date of Patent: Mar. 31, 2009

(54) HIGH-EFFICIENCY DIFFERENTIAL RADAR SYSTEM

(75) Inventors: Andrei Grebennikov, Linz (AT); Günter Haider, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/015,416

(22) Filed: Jan. 16, 2008

(51) Int. Cl.
*G01S 13/00* (2006.01)
(52) U.S. Cl. .......................................... 342/175; 342/70
(58) Field of Classification Search .................... 342/27, 342/28, 70–72, 175
See application file for complete search history.

(56) References Cited

U.S. PATENT DOCUMENTS

| | | | | |
|---|---|---|---|---|
| 3,794,997 A | * | 2/1974 | Iwatsuki et al. ............... | 342/72 |
| 4,451,831 A | * | 5/1984 | Stangel et al. .............. | 342/374 |
| 4,553,113 A | | 11/1985 | Blanchard | |
| 4,633,259 A | * | 12/1986 | Hrycak ....................... | 342/373 |
| 4,980,925 A | * | 12/1990 | Blustine et al. ............. | 455/327 |
| 5,008,678 A | * | 4/1991 | Herman ....................... | 342/158 |
| 5,475,391 A | * | 12/1995 | Spencer ........................ | 342/62 |
| 5,583,511 A | * | 12/1996 | Hulderman ................... | 342/175 |
| 5,661,485 A | * | 8/1997 | Manuel ........................ | 342/13 |
| 6,194,980 B1 | * | 2/2001 | Thon ........................... | 333/109 |
| 6,232,920 B1 | * | 5/2001 | Brookner et al. ............. | 342/372 |
| 7,196,657 B2 | * | 3/2007 | Walton ........................ | 342/195 |

\* cited by examiner

*Primary Examiner*—Thomas H Tarcza
*Assistant Examiner*—Peter M Bythrow
(74) *Attorney, Agent, or Firm*—Eschweiler & Associates, LLC

(57) ABSTRACT

One embodiment relates to a radar system. In one embodiment, an automotive radar system comprises a power amplifier configured to provide first and second anti-phase transmission signals to respective first and second differential couplers which are individually connected to respective first and second transceiving antennas. A first portion of the first anti-phase transmission signal is coupled to the first antenna and a second portion of the first anti-phase transmission signal is coupled to a third transceiving antenna by way of a third differential coupler. A first portion of the second anti-phase transmission signal is coupled to the second antenna and a second portion of the second anti-phase transmission signal is coupled to the third antenna by way of the third differential coupler. Configured in this manner, the radar system is operable to transmit and receive from the multiple antennas with high efficiency, while maintaining low-cost and reduced overall size.

25 Claims, 7 Drawing Sheets

HIGH-EFFICIENCY DIFFERENTIAL RADAR SYSTEM

BACKGROUND OF THE INVENTION

In microwave and millimeter-wave automotive radar systems, low cost and high performance radar is required. The typical radar system includes an oscillator, a divider, a power amplifier and a differential (or quadrature) hybrid combiner, using a single antenna to reduce the entire size. However, such a radar system is not very efficient since only half an output power flows to the antenna, while the other half flows to the ballast resistor of the hybrid. Alternately, if two separate transmitting and receiving antennas are utilized, the overall area occupied by the radar system is too large to embody a miniature radar system. In addition, the complete car radar system usually requires several transmitting and receiving paths with corresponding antennas to properly monitor the space from all sides of the car.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, a radar system comprises a power amplifier configured to provide first and second transmission signals from respective first and second outputs of the power amplifier, for first, second and third antennas for transmitting and receiving radar signals. The system also comprises first, second and third couplers, the first coupler coupled between the first output of the power amplifier and the first antenna, the second coupler coupled between the second output of the power amplifier and the second antenna, and the third coupler coupled to the third antenna and also between an output port of the first coupler and an output port of the second coupler. A first portion of the first transmission signal is coupled to the first antenna and a second portion of the first transmission signal is coupled to a third antenna by way of a third differential coupler. A first portion of the second transmission signal is coupled to the second antenna and a second portion of the second transmission signal is coupled to the third antenna by way of the third differential coupler. Configured in this manner, the radar system is operable to transmit and receive from the multiple antennas with high efficiency, while maintaining low-cost and reduced overall size.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with respect to the accompanying drawings in which like numbered elements represent like parts. The figures and the accompanying description of the figures are provided for illustrative purposes and do not limit the scope of the claims in any way.

Figure 1:
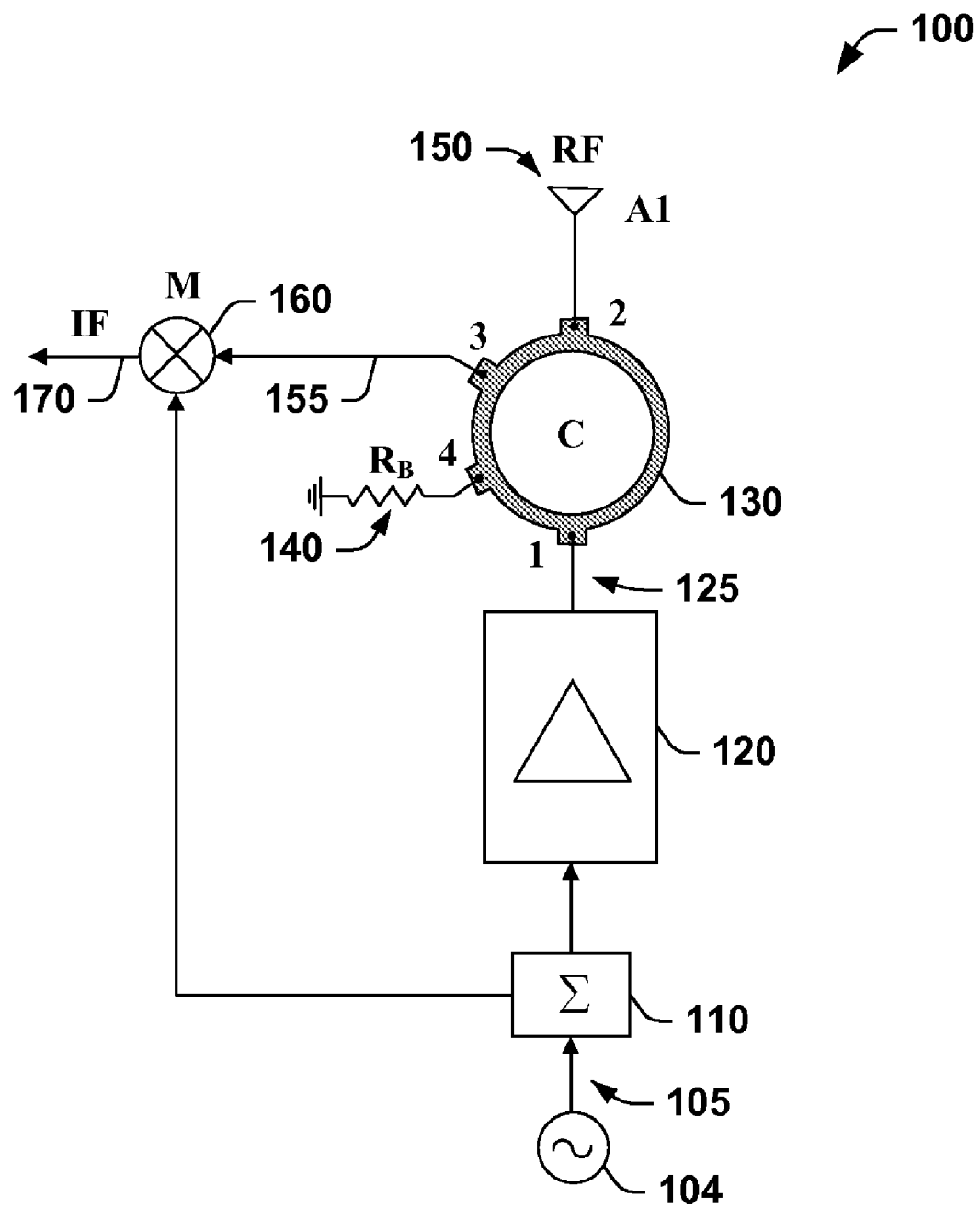
FIG. 1 is a simplified schematic diagram of a conventional automotive RADAR system.

In microwave and millimeter-wave automotive radar systems, low cost and high performance radar is desired. FIG. 1 illustrates one conventional automotive RADAR system 100 for transmitting and receiving radar signals with a single antenna so the entire size can be reduced. Radar system 100 comprises an oscillator 104 operable to supply a radio frequency (RF) signal 105 such as a millimeter wavelength signal. RADAR system 100 further comprises a divider 110 which splits and drives the RF signal 105 to a power amplifier 120 and to a mixer (M) 160. The power amplifier 120 is used for amplifying and driving a radar transmission signal 125 into an antenna 150 and a ballast resistor 140, by way of a rat-race coupler or hybrid coupler 130. The mixer M 160 combines a received radar signal 155 from the antenna 150 by way of the coupler 130, with the original RF signal 105 by way of the divider 110, to provide an intermediate frequency (IF) signal 170. Thereafter, the IF signal 170 may be passed to a conventional RADAR detection system (not shown).

However, the conventional radar system 100 of FIG. 1 is not very efficient, since only half (50%) of the output power of the radar transmission signal 125 flows to the antenna 150, while the other half flows to the ballast resistor 140 on the hybrid coupler 130.

In a complete practical automotive RADAR system, however, several transmitting and receiving paths with corresponding antennas are typically implemented to properly cover the monitored regions surrounding a car. Accordingly, another conventional RADAR system comprises two separate transmitting and receiving antennas, however, the overall area occupied by such a RADAR system may be too large to embody the desired miniature RADAR system, and the separate systems still do not address the loss of half the transmission power into the ballast resistor of each system.

Embodiments of the present invention provide a RADAR system in which no power flows into a ballast resistor, but instead flows into an additional antenna which can be utilized in the complete RADAR system. In one embodiment, the RADAR system comprises an arrangement of couplers which reduces or eliminates waste of receiving and transmitting power.

Figure 2:
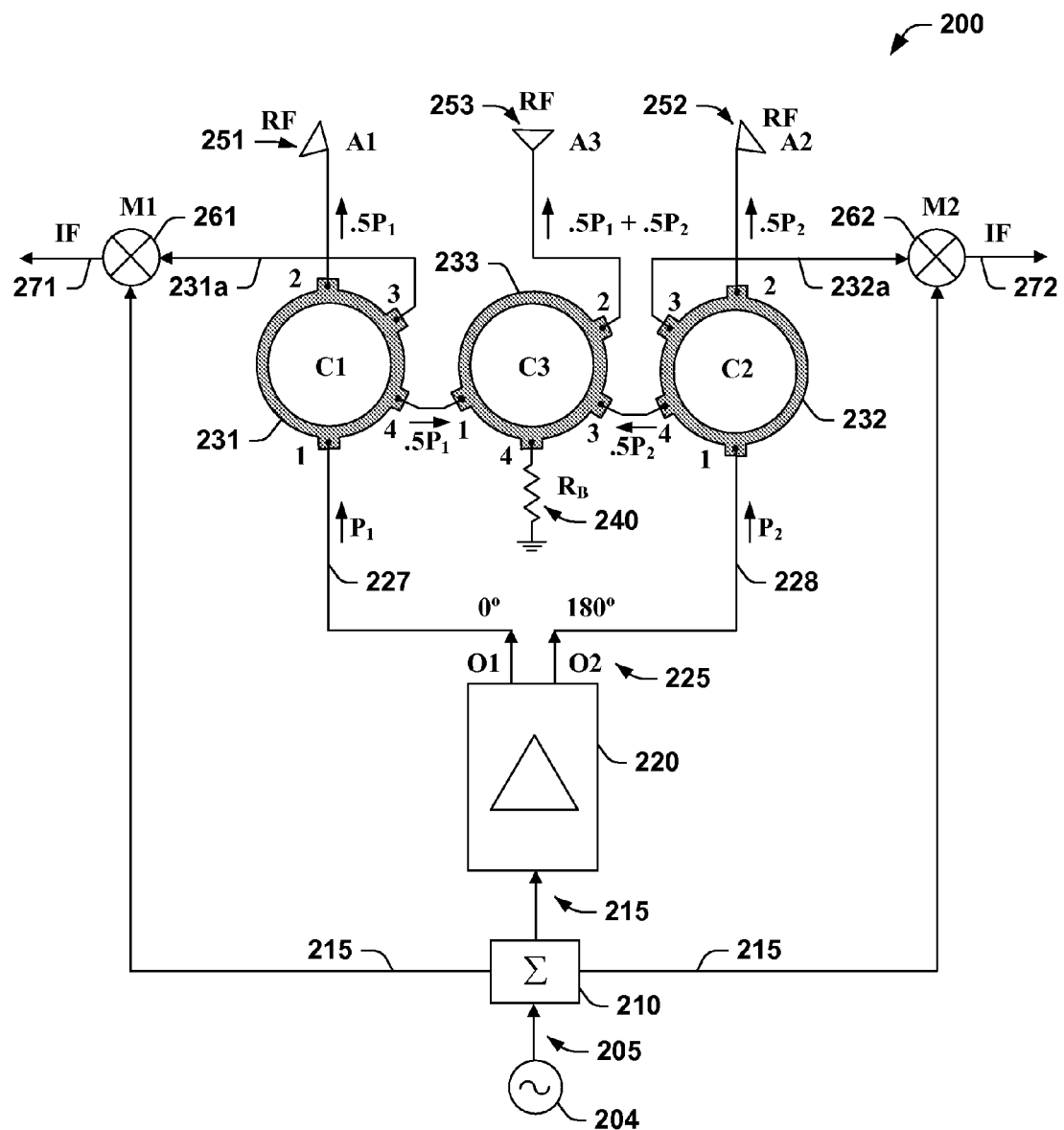
FIG. 2 is a simplified schematic diagram of one high efficiency differential RADAR system utilizing two out-of-phase transmission signals and three rat-race couplers, in accordance with one or more aspects of the present invention.

FIG. 2, for example, illustrates an exemplary high efficiency differential RADAR system 200 utilizing two anti-phase (out-of-phase) transmission signals 225 and three rat-race couplers C1 231, C2 232, and C3 233, in accordance with one or more aspects of the present invention.

Radar system 200 comprises an oscillator 204 operable to supply a radio frequency (RF) signal 205 such as a millimeter wavelength signal (e.g., 76-81 GHz). RADAR system 200 further comprises a divider 210 which splits and drives the RF signal 205 into a power amplifier 220 and to first and second mixers M1 261 and M2 262, respectively. The power amplifier 220 amplifies and drives first and second anti-phase (out-of-phase) radar transmission signals 227 and 228, respectively, into first and second antennas A1 251 and A2 252, respectively, by way of rat-race couplers or differential hybrid couplers C1 231 and C2 232, respectively (e.g., differential couplers, rat-race couplers, lumped hybrids or distributed hybrids).

In contrast to conventional RADAR systems in which half of the power of each of the first and second anti-phase radar transmission signals 227 and 228 may be wasted, differential couplers C1 231 and C2 232 are arranged and configured to route one-half of their received power P1 and P2 to a third antenna A3 253 by way of a third differential couplers C3 233.

For example, the first anti-phase radar transmission signal 227 (e.g., at 0°) is supplied to port 1 of coupler C1 231, having full (100%) power P1. Coupler C1 231 supplies half of this power (0.5P1) to antenna A1 251 from port 2, and the other half of this power (0.5P1) to the third antenna A3 253 by way of port 4 of coupler C1 231 which is coupled to port 1 of coupler C3 233. Similarly, the second anti-phase radar transmission signal 228 (e.g., at 180°) is supplied to port 1 of coupler C2 232, having full (100%) power P2. Coupler C2 232 supplies half of this power (0.5P2) to antenna A2 252 from port 2, and the other half of this power (0.5P2) to the third antenna A3 253 by way of port 4 of coupler C2 232 which is coupled to port 3 of coupler C3 233.

In this way, for example, coupler C3 233 receives (0.5P1) at port 1 by way of port 4 of coupler C1 231, and receives (0.5P2) at port 3 by way of port 4 of coupler C2 232. Thus, coupler C3 233 receives a total power of 0.5P1+0.5P2 to be supplied to antenna A3 253 for useful transmission, and no power (or substantially no power) is wasted in a ballast resistor. As a result, the RADAR system 200 of the present invention is configured to transmit radar signals with much more energy efficiency and with fewer components than separate conventional RADAR systems having similar functional capabilities.

For receiving RADAR signals, the RADAR system 200 of the present invention further comprises first and second mixers M1 261 and M2 262 which are coupled to respective differential couplers C1 231 and C2 232, respectively. For example, M1 261 combines a received radar signal 231a from the first antenna A1 251 by way of port 3 of coupler C1 231, with the original RF signal 205 by way of the divider 210, to provide an intermediate frequency (IF) signal 271. Similarly, M2 262 combines a received radar signal 232a from the second antenna A2 252 by way of port 3 of coupler C2 232, with the original RF signal 205 by way of the divider 210, to provide an IF signal 272. Finally, the first and second mixers M1 261 and M2 262, respectively, are further configured to combine a receiving radar signal from the third antenna A3 253 with the RF signal 205 from the divider 210 to provide a third intermediate frequency (IF) signal (e.g., 271+272) at both first and second mixers M1 261 and M2 262, respectively. Thereafter, the IF signals 271 and 272 may be passed to respective conventional RADAR detection systems (not shown).

Figure 3:
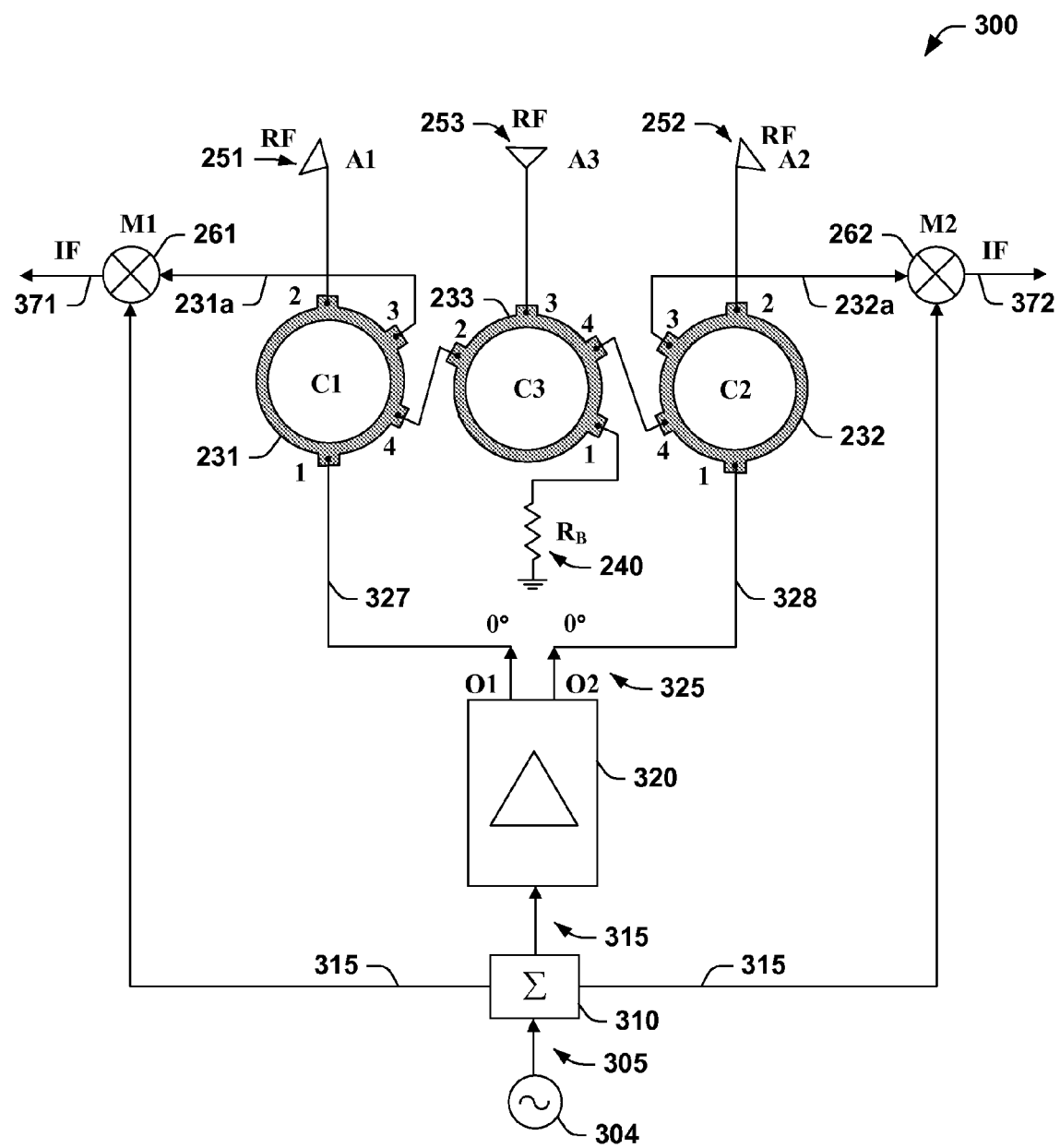
FIG. 3 is a simplified schematic diagram of an exemplary high efficiency differential RADAR system utilizing two in-phase transmission signals and three rat-race couplers, in accordance with one or more aspects of the present invention.

FIG. 3 illustrates another exemplary high efficiency differential RADAR system 300 utilizing two in-phase transmission signals 325 and three rat-race couplers C1 231, C2 232, and C3 233, in accordance with one or more aspects of the present invention.

Radar system 300 comprises an oscillator 304 operable to supply a radio frequency (RF) signal 305 such as a millimeter wavelength signal (e.g., 76-81 GHz). RADAR system 300 further comprises a divider 310 which splits and drives the RF signal 305 into a power amplifier 320 and to first and second mixers M1 261 and M2 262, respectively. The power amplifier 320 amplifies and drives first and second in-phase radar transmission signals 327 and 328, respectively, into first and second antennas A1 251 and A2 252, respectively, by way of rat-race couplers or differential hybrid couplers C1 231 and C2 232, respectively (e.g., differential couplers, rat-race couplers, lumped hybrids or distributed hybrids).

Again, in contrast to a conventional RADAR system, rather than wasting half of the power of each of the first and second in-phase radar transmission signals 327 and 328, differential couplers C1 231 and C2 232 are arranged and configured to route one-half of their received power to a third antenna A3 253 by way of a third differential couplers C3 233.

For example, the first in-phase radar transmission signal 327 (e.g., at 0°) is supplied to port 1 of coupler C1 231, having full (100%) power P1. Coupler C1 231 supplies half of this power (0.5P1) to antenna A1 251 from port 2, and the other half of this power (0.5P1) to the third antenna A3 253 by way of port 4 of coupler C1 231 which is coupled to port 2 of coupler C3 233. Similarly, the second in-phase radar transmission signal 328 (e.g., also at 0°) is supplied to port 1 of coupler C2 232, having full (100%) power P2. Coupler C2 232 supplies half of this power (0.5P2) to antenna A2 252 from port 2, and the other half of this power (0.5P2) to the third antenna A3 253 by way of port 4 of coupler C2 232 which is coupled to port 4 of coupler C3 233.

In this way, for example, coupler C3 233 receives (0.5P1) at port 2 by way of port 4 of coupler C1 231, and receives (0.5P2) at port 4 by way of port 4 of coupler C2 232. Thus, coupler C3 233 again receives a total power of 0.5P1+0.5P2 to be supplied to antenna A3 253 for useful transmission, and no power is wasted in a ballast resistor. As a result, the RADAR system 300 of the present invention is configured to transmit radar signals with much more energy efficiency and with fewer components than separate conventional RADAR systems having similar functional capabilities.

For receiving RADAR signals, the RADAR system 300 of the present invention further comprises first and second mixers M1 261 and M2 262 which are coupled to respective differential couplers C1 231 and C2 232 respectively. For example, M1 261 combines a received radar signal 231a from the first antenna A1 251 by way of port 3 of coupler C1 231, with the original RF signal 305 by way of the divider 310, to provide an intermediate frequency (IF) signal 371. Similarly, M2 262 combines a received radar signal 232a from the second antenna A2 252 by way of port 3 of coupler C2 232, with the original RF signal 305 by way of the divider 310, to provide an IF signal 372. Finally, the first and second mixers M1 261 and M2 262, respectively, are further configured to combine a receiving radar signal from the third antenna A3 253 with the RF signal 305 from the divider 310 to provide a third intermediate frequency (IF) signal (e.g., 371+372) at both first and second mixers M1 261 and M2 262, respectively. Thereafter, the IF signals 371 and 372 may be passed to respective conventional RADAR detection systems (not shown).

Figure 4:
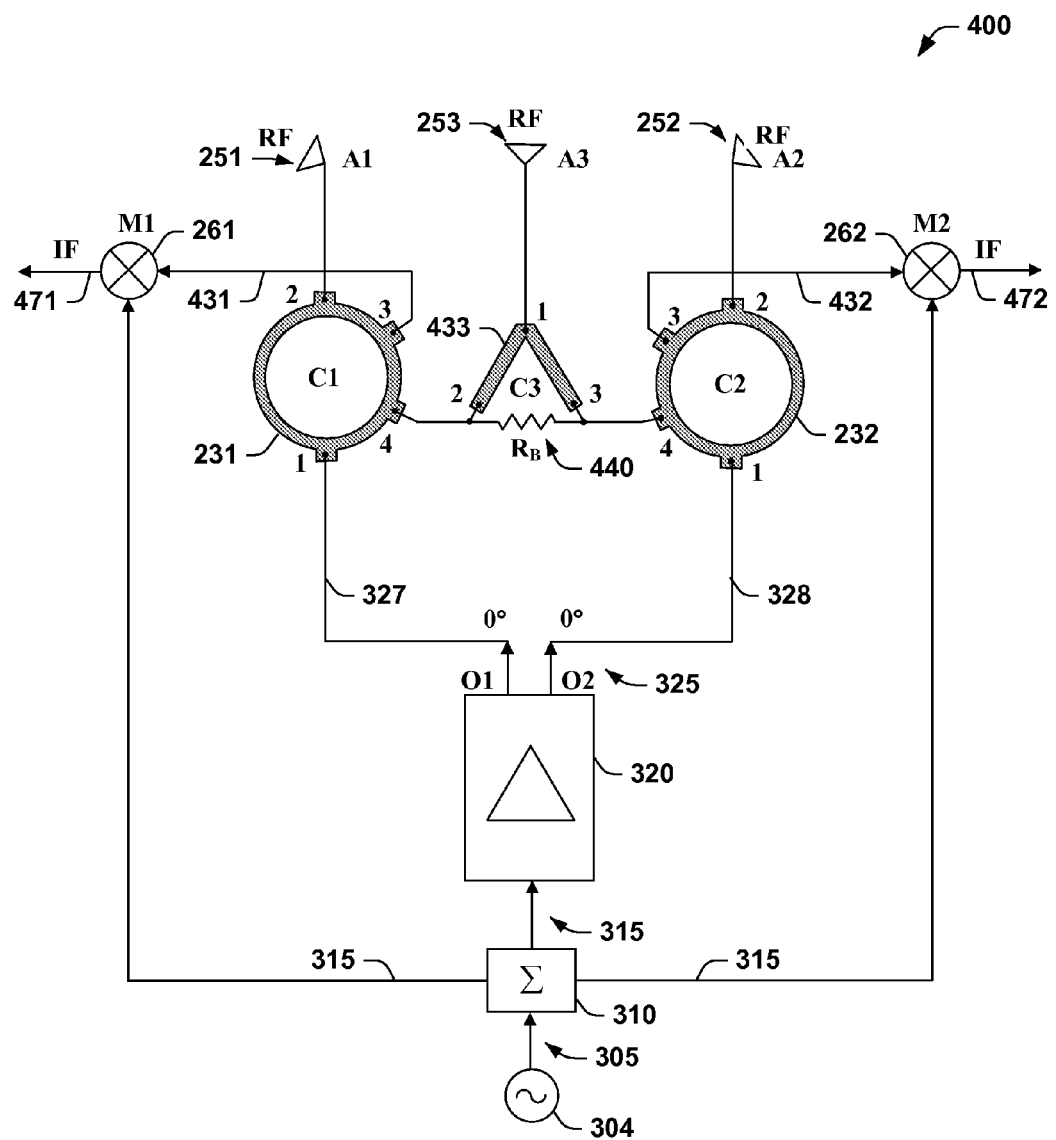
FIG. 4 is a simplified schematic diagram of an exemplary high efficiency differential RADAR system utilizing two in-phase transmission signals, two rat-race couplers and a Wilkinson combiner/divider, in accordance with one or more aspects of the present invention.

FIG. 4 illustrates yet another exemplary high efficiency differential RADAR system 400 utilizing two in-phase transmission signals 325, two rat-race couplers C1 231, C2 232 and a Wilkinson combiner/divider C3 433, in accordance with one or more aspects of the present invention.

Radar system 400 comprises an oscillator 304 operable to supply a radio frequency (RF) signal 305 such as a millimeter wavelength signal (e.g., 76-81 GHz). RADAR system 300 further comprises a divider 310 which splits and drives the RF signal 305 into a power amplifier 320 and to first and second mixers M1 261 and M2 262, respectively. The power amplifier 320 amplifies and drives first and second in-phase radar transmission signals 327 and 328, respectively, into first and second antennas A1 251 and A2 252, respectively, by way of rat-race couplers or differential hybrid couplers C1 231 and C2 232, respectively (e.g., differential couplers, rat-race couplers, lumped hybrids or distributed hybrids).

Again, the RADAR system of the present invention does not waste half of the power of each of the radar transmission signals 327 and 328 in a ballast resistor, instead, differential couplers C1 231 and C2 232 are arranged and configured to route one-half of their received respective power to a third antenna A3 253 by way of the third coupler C3 433 comprising the Wilkinson combiner/divider C3 433, having a ballast resistor R$_B$ 440 connected between ports 2 and 3 of coupler C3 433.

For example, the first in-phase radar transmission signal 327 (e.g., at 0°) is supplied to port 1 of coupler C1 231, having full (100%) power P1. Coupler C1 231 supplies half of this power (0.5P1) to antenna A1 251 from port 2, and the other half of this power (0.5P1) to the third antenna A3 253 at port 1 of C3 433, by way of port 4 of coupler C1 231 which is coupled to port 2 of coupler C3 433. Similarly, the second in-phase radar transmission signal 328 (e.g., also at 0°) is supplied to port 1 of coupler C2 232, having full (100%) power P2. Coupler C2 232 supplies half of this power (0.5P2) to antenna A2 252 from port 2, and the other half of this power (0.5P2) to the third antenna A3 253 at port 1 of C3 433, by way of port 4 of coupler C2 232 which is coupled to port 3 of coupler C3 433.

In this way, for example, coupler C3 433 receives (0.5P1) at port 2 by way of port 4 of coupler C1 231, and receives (0.5P2) at port 3 by way of port 4 of coupler C2 232. Thus, coupler C3 433 again receives a total power of 0.5P1+0.5P2 to be supplied to antenna A3 253 for useful transmission, and no power is wasted in a ballast resistor. As a result, the RADAR system 300 of the present invention is configured to transmit radar signals with much more energy efficiency and with fewer components than separate conventional RADAR systems having the same functional capabilities.

For receiving RADAR signals, the RADAR system 400 of the present invention further comprises first and second mixers M1 261 and M2 262 which are coupled to respective differential couplers C1 231 and C2 232, respectively. For example, M1 261 combines a received radar signal 431 from the first antenna A1 251 by way of port 3 of coupler C1 231, with the original RF signal 305 by way of the divider 310, to provide an intermediate frequency (IF) signal 471. Similarly, M2 262 combines a received radar signal 432 from the second antenna A2 252 by way of port 3 of coupler C2 232, with the original RF signal 305 by way of the divider 310, to provide an IF signal 472. Finally, the first and second mixers M1 261 and M2 262, respectively, are further configured to combine a receiving radar signal from the third antenna A3 253 with the RF signal 305 from the divider 310 to provide a third intermediate frequency (IF) signal (e.g., 471+472) at both first and second mixers M1 261 and M2 262, respectively. Thereafter, the IF signals 471 and 472 may be passed to respective conventional RADAR detection systems (not shown).

Figure 5:
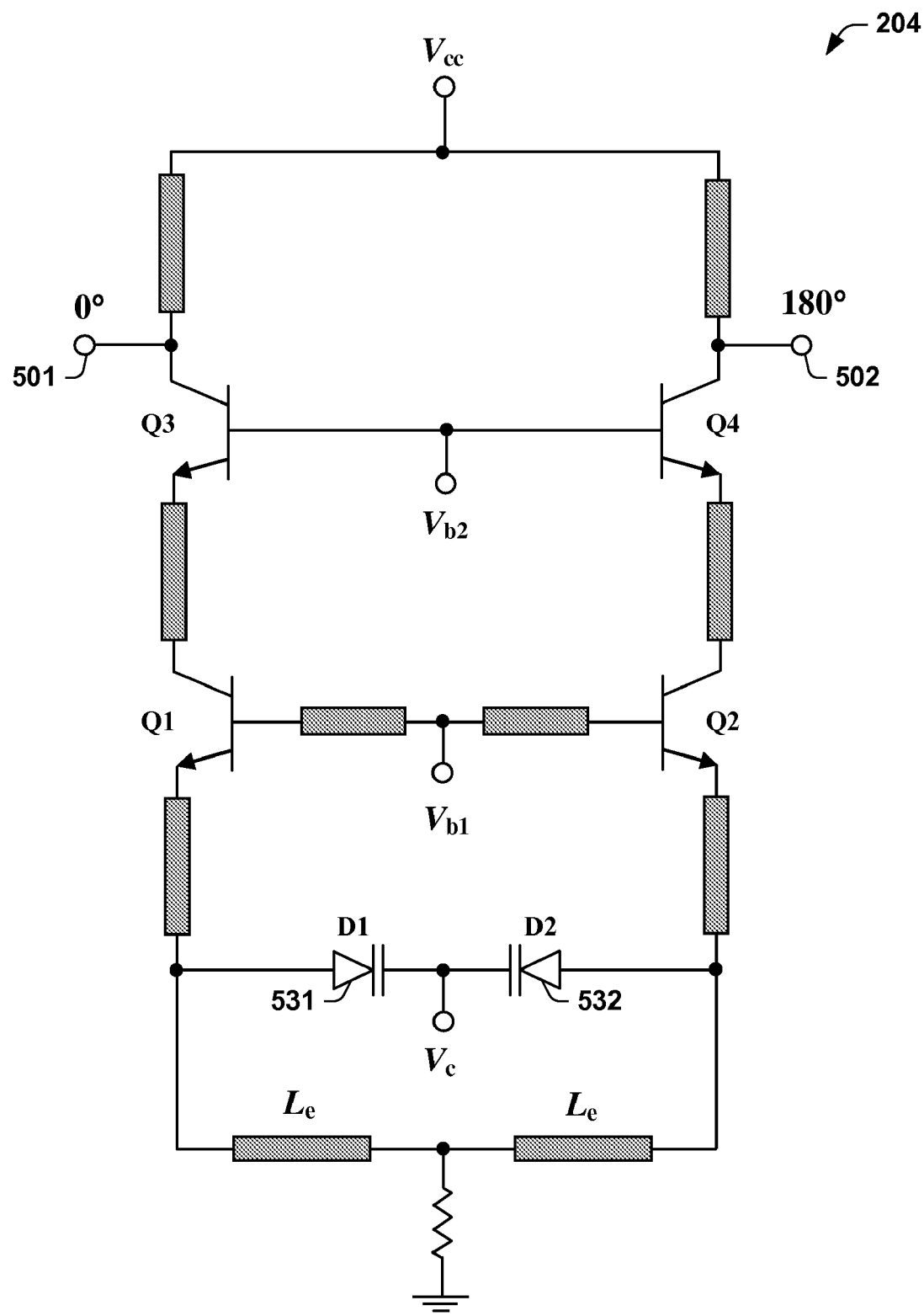
FIG. 5 is a simplified schematic diagram of one exemplary embodiment of a differential voltage controlled oscillator (VCO), such as may be used in the exemplary radar systems of FIGS. 2-4 of the present invention.
Figure 6:
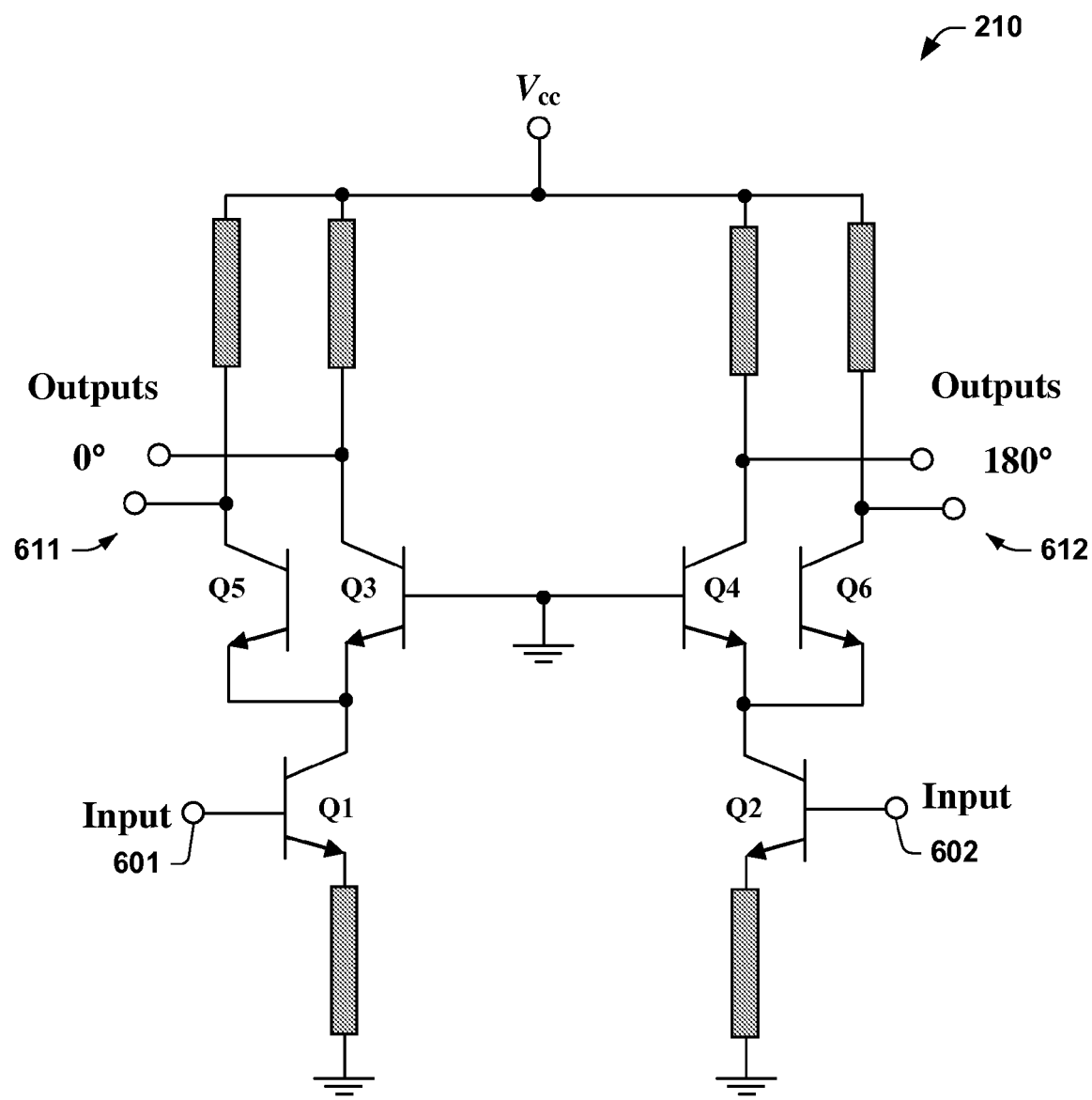
FIG. 6 is a simplified schematic diagram of an exemplary embodiment of a differential active power divider having two outputs, such as a similar three-output version that may be used in the exemplary radar systems of FIGS. 2-4 of the present invention.
Figure 7:
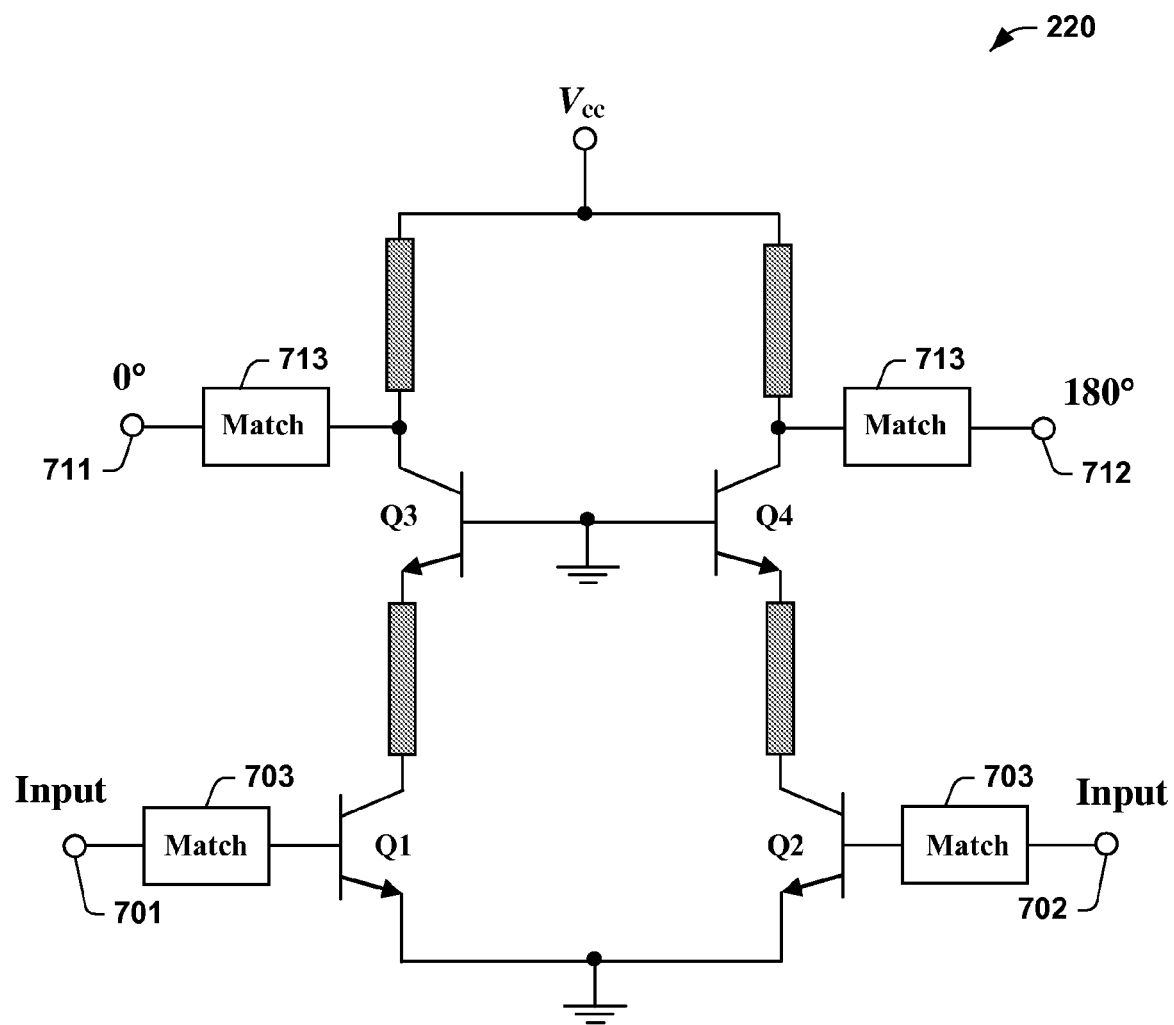
FIG. 7 is a simplified schematic diagram of an exemplary single-stage push-pull cascode power amplifier (PA), such as may be used in the exemplary radar systems of FIGS. 2-4 of the present invention.

FIGS. 5-7 illustrate exemplary embodiments of the oscillator 204, divider 210, and power amplifier 220, such as may be used in different versions in the exemplary radar systems 200 of FIG. 2, 300 of FIGS. 3 and 400 of FIG. 4, of the present invention.

FIG. 5, for example, illustrates one exemplary embodiment of a differential voltage controlled oscillator (VCO) 204, such as may be used in the exemplary radar system 200 of FIG. 2 of the present invention. VCO 204 provides a 0° phase output 501 and a 180° phase output 502 which collectively represent the differential RF signal output 205 of FIG. 2.

The differential VCO 204 comprises varactor diodes D1 531 and D2 532 which may be used to tune the VCO 204 to RF frequencies, for example, of between 76-81 GHz, based on a capacitive voltage V$_C$ of between 1-5VDC, for example. The cascode configuration of transistors Q1-Q4 provides balanced differential signals for out-of-phase outputs, as shown at outputs 501 and 502, for example to drive a differential divider 210, or the outputs may also be provided in-phase to provide one or more in-phase signals 305 as shown in association with oscillator 304 of FIGS. 3 and 4.

In addition, oscillator 204 or 304 may be provided for the RADAR systems of FIGS. 2-4 in a single-ended or a differential circuit topology, or single-ended or differential signal and output format. However, the mixers (e.g., M1 261, M2 262) are usually designed based on a double-balanced topology for better performance such as the differential topology. Thus, it will be appreciated that the single lines connecting the functional blocks may represent double-lines when the differential topology is utilized herein.

FIG. 6 illustrates an exemplary embodiment of a differential active power divider 210 having two 0° phase outputs 611 and two 180° phase outputs 612. A similar three-output configuration may collectively represent the differential three-way divider signal outputs 215 of FIG. 2, such as may be used in the exemplary radar system 200 of FIG. 2 of the present invention.

Power divider 210 comprises differential inputs 601 and 602, which collectively may represent the signal inputs 215 of FIG. 2. Divider 210 is also arranged in a cascode configuration of transistors Q1-Q6, providing balanced differential signals that may be configured to provide the out-of-phase outputs as shown at outputs 611 and 612, for example to drive the input of a power amplifier 220, or the outputs may also be provided in-phase to provide one or more in-phase signals 315 as shown in association with divider 310 of FIGS. 3 and 4. In addition, divider 310 may be provided in a single-ended or a differential signal and output format for the RADAR systems of FIGS. 2-4.

FIG. 7 illustrates an exemplary single-stage push-pull cascode power amplifier (PA) 220, such as may be used in the exemplary radar system 200 of FIG. 2 of the present invention. Amplifier PA 220 comprises differential inputs 701 (e.g., 0° phase) and 702 (e.g., 180° phase), which collectively may represent the anti-phase signal inputs 215 of FIG. 2, or the in-phase signal inputs 315 of FIGS. 3 and 4 having in-phase signal outputs 325 associated with power amplifier 320.

Power amplifier PA 220 is also arranged in a cascode configuration of transistors Q1-Q4, providing balanced differential signals that may be configured to provide the out-of-phase signal outputs as shown at outputs 711 (e.g., 0° phase) and 712 (e.g., 180° phase), which collectively may represent the power amplifier signal outputs or RADAR transmission signals 225 (e.g., 227, 228) of FIG. 2 for example, to drive the first and second couplers C1 231 and C2 232, respectively. The outputs may also be utilized to provide one or more in-phase signal outputs 325 (e.g., 327, 328) of power amplifier 330 or RADAR transmission signals 325 for example, to drive the first and second couplers C1 231 and C2 232, respectively, of FIGS. 3 and 4.

Power amplifier PA 220 of FIG. 7 may further comprise input matching circuits 703 and output matching circuits 713 to accommodate variations in the impedances of the circuits which interface with the power amplifier PA 220.

In addition, it will be appreciated that in the differential RADAR systems of FIGS. 2-4 the term "differential" can mean out-of-phase, because only out-of-phase input signals may be necessary for normal operation of the differential amplifier. Thus, any differential VCO, splitter, or amplifier would have both input and output signals out-of-phase, for example, having a phase difference of 180° (e.g., −90° and +90°). If the phase difference of these signals is 0 degrees, then this means an in-phase or parallel operation. Both in-phase and out-of-phase topologies are contemplated as is illustrated and described herein.

Those skilled in the art will appreciate that the oscillator (e.g., 304), the divider (e.g., 310), and the power amplifier 320 utilized in the in-phase RADAR systems of FIGS. 3 and 4 may not require all of the illustrated circuit components in some configurations or applications. Many other oscillator, divider and power amplifier circuit variations are also contemplated in the context of the present invention, wherein two transmission signals feed three couplers and three antennas to provide high efficiency RADAR transmission.

The RADAR systems illustrated and described in the present invention are suitable for use in various automotive RADAR system applications. For example, RADAR antenna A1 of FIGS. 2-4 may be configured to cover the front-left area before an automobile, antenna A2 may cover the front-right area, and antenna A3 may be used to cover the front-central area before the automobile. Likewise, the three antennas of the RADAR system may be used for the rear areas of the automobile, side areas, or any combination of such areas. Further, the RADAR systems illustrated and described herein are equally suitable for use in truck tractor and trailor, marine, aviation, or any other vehicle based RADAR system applications, for example, including moving and even stationary applications where such high efficiency RADAR systems can be utilized.

In addition to or in substitution of one or more of the illustrated components, the illustrated RADAR system and other systems of the invention may include suitable circuitry, state machines, firmware, software, logic, etc. to perform the various methods and functions illustrated and described herein, including but not limited to the methods described below.

In one embodiment, a method of efficiently transmitting in a RADAR system comprises providing first and second transmission signals, driving a first portion of the first transmission signal into a first antenna and a second portion of the first transmission signal into a third antenna, and driving the first portion of the second transmission signal into a second antenna and a second portion of the second transmission signal into the third antenna. The method further includes transmitting first, second and third radar signals from the respective first, second and third antennas, based on the first and second portions of the first and second transmission signals driven thereto.

In another embodiment, a method of efficiently transmitting in an automotive RADAR system comprises amplifying first and second transmission signals at respective first and second outputs of a power amplifier, and driving first, second and third antennas using the first and second transmission signals. The three antennas can be driven by driving the first transmission signal into a first differential coupler which is coupled between the first output of the power amplifier and a first antenna, driving the second transmission signal into a second differential coupler which is coupled between the second output of the power amplifier and a second antenna, and by coupling a portion of the first and second transmission signals to a third differential coupler coupled to the third antenna and between an output port of the first differential coupler and an output port of the second differential coupler. Using this configuration, a first portion of the first transmission signal is coupled to the first antenna and a second portion of the first transmission signal is coupled to the third antenna, and a first portion of the second transmission signal is coupled to the second antenna and a second portion of the second transmission signal is coupled to the third antenna. Thereafter, first, second and third radar transmission signals may be transmitted by way of the respective first, second and third antennas, based on the amplified portions of the first and second transmission signals coupled thereto.

In one embodiment, the first and second transmission signals may comprise anti-phase transmission signals or in-phase transmission signals.

In another embodiment of the method, the first and second portions of the first and second transmission signals may be divided by and coupled to the respective first, second and third antennas using respective first, second and third couplers, such as one or more or a combination of a rat-race coupler, lumped hybrid, distributed hybrid, or a Wilkinson combiner/divider, for example.

While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of systems which are illustrated and described herein (e.g., embodiments, RADAR system 200 of FIG. 2, RADAR system 300 of FIG. 3 and RADAR system 400 of FIG. 4) as well as in association with other systems not illustrated, wherein all such implementations are contemplated as falling within the scope of the present invention and the appended claims.

Although the invention has been illustrated and described with respect to one or more implementations, alterations and/or modifications may be made to the illustrated examples without departing from the spirit and scope of the appended claims.

For example, in one embodiment, the load could be a solenoid. Further such a solenoid could be employed in an automotive system, such as an automatic transmission. In other embodiments, the load could be any other loads that a user desires to drive at an average load current and frequency.

Further, although in the illustrated embodiments, the one or more transistors are n-type metal-oxide semiconductor field effect transistors (MOSFETs), p-type MOSFETS could also be used including other types of switching devices (in other embodiments, any type of bipolar and field-effect transistors, vacuum tubes, relays, etc.). Numerous other such variations are also possible within the spirit and scope of the invention, and as such are anticipated.

Further, in various embodiments, portions of the RADAR systems 200, 300 and 400 may be integrated into an integrated circuit, although in other embodiments the RADAR system may be comprised of discrete devices.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (or another functionally equivalent embodiment), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, to the extent that the terms "number", "plurality", "series", or variants thereof are used in the detailed description or claims, such terms are to include any number including, but not limited to: positive integers, negative integers, zero, and other values.

What is claimed is:

1. A radar system, comprising:
   a power amplifier configured to provide first and second transmission signals from respective first and second outputs of the power amplifier;
   first, second and third antennas for transmitting and receiving radar signals; and
   first, second and third couplers, the first coupler coupled between the first output of the power amplifier and the first antenna, the second coupler coupled between the second output of the power amplifier and the second antenna, and the third coupler coupled to the third antenna and also between an output port of the first coupler and an output port of the second coupler,
   wherein a first portion of the first transmission signal is coupled to the first antenna and a second portion of the first transmission signal is coupled to the third antenna, and
   wherein a first portion of the second transmission signal is coupled to the second antenna and a second portion of the second transmission signal is coupled to the third antenna.

2. The system of claim 1, further comprising
   first and second mixers, the first mixer coupled between an output port of the first coupler and a first output of a divider, the second mixer coupled between an output port of the second coupler and a second output of the divider, the first mixer configured to combine a receiving radar signal from the first antenna with a radio frequency signal from the divider to provide a first intermediate frequency signal, the second mixer configured to combine a receiving radar signal from the second antenna with the RF signal from the divider to provide a second intermediate frequency signal;
   wherein the first and second mixers are further configured to combine a receiving radar signal from the third antenna with the radio frequency signal from the divider to provide a third intermediate frequency signal at each of the first and second mixers.

3. The system of claim 1, further comprising:
   an oscillator configured to provide a radio frequency signal; and
   a divider configured to receive the radio frequency signal from the oscillator and to provide the radio frequency signal at two or more outputs thereof, and to provide the radio frequency signal to the power amplifier.

4. The system of claim 1, wherein the first portion of the first transmission signal coupled to the first antenna is substantially the same as the second portion of the first transmission signal coupled to the third antenna, and wherein the first portion of the second transmission signal coupled to the second antenna is substantially the same as the second portion of the second transmission signal coupled to the third antenna, wherein the power available for transmission at the third antenna is about two times greater than the powers available for transmission at the first and second antennas.

5. The system of claim 1, wherein the first and second transmission signals from the respective first and second outputs of the power amplifier are in-phase and are about the same amplitude.

6. The system of claim 1, further comprising a ballast resistor connected to a port of the third coupler, and wherein no power flows to the ballast resistor.

7. The system of claim 1, wherein one or more of the first, second and third couplers comprise one of a rat-race coupler, lumped hybrid, distributed hybrid, and a Wilkinson combiner/divider.

8. The system of claim 1, wherein the first and second couplers comprise one of a rat-race coupler, lumped hybrid, distributed hybrid, and the third coupler comprises a Wilkinson combiner/divider.

9. A radar system, comprising:
   an oscillator configured to provide a radio frequency signal;
   a divider configured to receive the radio frequency signal from the oscillator and to provide the radio frequency signal at two or more outputs thereof;
   a power amplifier operably coupled to a first output of the divider, the power amplifier configured to provide first and second anti-phase transmission signals from respective first and second outputs of the power amplifier;
   first, second and third antennas for transmitting and receiving radar signals;
   first, second and third differential couplers, the first coupler coupled between the first output of the power amplifier and the first antenna, the second coupler coupled between the second output of the power amplifier and the second antenna, and the third coupler coupled to the third antenna and between an output port of the first coupler and an output port of the second coupler,
   wherein a first portion of the first anti-phase transmission signal is coupled to the first antenna and a second portion of the first anti-phase transmission signal is coupled to the third antenna by way of the third differential coupler, and
   wherein a first portion of the second anti-phase transmission signal is coupled to the second antenna and a second portion of the second anti-phase transmission signal is coupled to the third antenna by way of the third differential coupler; and first and second mixers, the first mixer coupled between an output port of the first coupler and a second output of the divider, the second mixer coupled between an output port of the second coupler and a third output of the divider, the first mixer configured to combine a receiving radar signal from the first antenna with the radio frequency signal from the divider to provide a first intermediate frequency signal, the second mixer configured to combine a receiving radar signal from the second antenna with the radio frequency signal from the divider to provide a second intermediate frequency signal;

wherein the first and second mixers are further configured to combine a receiving radar signal from the third antenna with the radio frequency signal from the divider to provide a third intermediate frequency signal at respective first and second mixers.

10. The system of claim 9, wherein the first portion of the first anti-phase transmission signal coupled to the first antenna is substantially the same as the second portion of the first anti-phase transmission signal coupled to the third antenna, and wherein the first portion of the second anti-phase transmission signal coupled to the second antenna is substantially the same as the second portion of the second anti-phase transmission signal coupled to the third antenna, wherein the power available for transmission at the third antenna is about two times greater than the powers available for transmission at the first and second, antennas.

11. The system of claim 9, wherein the first and second anti-phase transmission signals from the respective first and second outputs of the power amplifier are about the same amplitude and are 180° out-of-phase with respect to each other.

12. The system of claim 9, further comprising a ballast resistor connected to a port of the third coupler, and wherein no power flows to the ballast resistor.

13. The system of claim 9, wherein two or more of the first, second and third differential couplers comprise one of rat-race couplers, lumped hybrids, and distributed hybrids.

14. The system of claim 9, wherein the oscillator and the divider are further configured to provide two anti-phase input signals to the power amplifier that are about the same amplitude and are 180° out-of-phase with respect to each other.

15. The system of claim 9, wherein the radar system comprises one of a microcontroller, an electronic chip, or a custom integrated circuit.

16. A radar system, comprising:
power amplification means for providing and amplifying first and second transmission signals;
first, second and third transmitting means for transmitting respective first, second and third radar signals based on the amplified first and second transmission signals;
first, second and third receiving means for receiving respective fourth, fifth and sixth radar signals;
first mixing means for combining the received fourth radar signal with a radio frequency signal to provide a first intermediate frequency signal,
second mixing means for combining the received fifth radar signal with the radio frequency signal to provide a second intermediate frequency signal;
wherein the first and second mixing means is further configured to combine the received sixth radar signal with the radio frequency signal to provide a third intermediate frequency signal at both first and second mixing means.

17. The system of claim 16, wherein the first, second and third transmitting and receiving means comprises first, second and third radar transceiver antennas.

18. The system of claim 16, wherein the amplified first and second transmission signals comprise anti-phase transmission signals.

19. The system of claim 16, wherein the amplified first and second transmission signals comprise in-phase transmission signals.

20. The system of claim 16, wherein the radar system comprises one of a microcontroller, an electronic chip, or a custom integrated circuit.

21. A method of efficiently transmitting in a radar system, comprising:
providing first and second transmission signals;
driving a first portion of the first transmission signal into a first antenna and a second portion of the first transmission signal into a third antenna;
driving the first portion of the second transmission signal into a second antenna and a second portion of the second transmission signal into the third antenna; and
transmitting first, second and third radar signals from the respective first, second and third antennas based on the first and second portions of the first and second transmission signals driven thereto.

22. The method of claim 21, wherein the first and second transmission signals comprise anti-phase transmission signals.

23. The method of claim 21, wherein the first and second transmission signals comprise in-phase transmission signals.

24. The method of claim 21, wherein the first and second portions of the first and second transmission signals are divided by and coupled to the respective first, second and third antennas using respective first, second and third couplers, comprising one or more or a combination of a rat-race coupler, lumped hybrid, distributed hybrid, and a Wilkinson combiner/divider.

25. The method of claim 21, wherein the driving the first portion of the first transmission signal into the first antenna and the second portion of the first transmission signal into the third antenna, comprises:
dividing the first transmission signal into the first and second portions of the first transmission signal using a first coupler,
coupling the first portion of the first transmission signal to the first antenna using the first coupler, and
coupling the second portion of the first transmission signal to the third antenna using the first coupler by way of a third coupler;
and wherein driving the first portion of the second transmission signal into the second antenna and the second portion of the second transmission signal into the third antenna, comprises:
dividing the second transmission signal into the first and second portions of the second transmission signal using a second coupler,
coupling the first portion of the second transmission signal to the second antenna using the second coupler, and
coupling the second portion of the second transmission signal to the third antenna using the second coupler by way of the third coupler.

* * * * *